United States Patent [19]
Takahashi

[11] Patent Number: 5,253,092
[45] Date of Patent: Oct. 12, 1993

[54] LATERAL MIM DEVICE AND METHOD OF PRODUCTION

[75] Inventor: Kotoyoshi Takahashi, Suwa, Japan

[73] Assignee: Seiko Epson Corporation, Tokyo, Japan

[21] Appl. No.: 823,923

[22] Filed: Jan. 22, 1992

[30] Foreign Application Priority Data

Jan. 25, 1991 [JP] Japan ................. 3-25355

[51] Int. Cl.$^5$ ............................................. G02F 1/133
[52] U.S. Cl. ....................................... 359/58; 359/60; 359/79; 257/40; 257/43
[58] Field of Search ............ 359/58, 60, 79; 257/35, 257/40, 43; 437/189

[56] References Cited

U.S. PATENT DOCUMENTS

| 4,534,623 | 8/1985 | Araki | 359/58 |
| 4,683,183 | 7/1987 | Ono | 430/20 |

FOREIGN PATENT DOCUMENTS

| 0255850 | 2/1988 | European Pat. Off. | |
| 0083723 | 4/1987 | Japan | 359/58 |

Primary Examiner—William L. Sikes
Assistant Examiner—Huy K. Mai
Attorney, Agent, or Firm—Gregory D. Ogrod

[57] ABSTRACT

A lateral MIM structure for use in liquid crystal and other optical display devices and method of manufacture, which eliminates deviations in element operating characteristics, especially for pixel electrodes, by utilizing top edges of the input signal conductor as active MIM element areas in combination with side conductor surfaces. The lateral MIM structure is made by electrically contouring insulation formed on a first conductor to have a lower resistance where it covers at least one side surface and top edge to allow MIM electrical interactions and than where it covers the remaining top surface so as to substantially prevent electrical interactions over this surface. A second conductor is then deposited on the insulation layer. This is accomplished by forming one insulation material on the top of the input conductor using a positive photoresist and etchback procedure, followed by forming a second insulation layer over the first and the conductor side surfaces and top edges. Alternatively, the first insulation material is etched using a negative photoresist and etch-back, followed by forming the second insulation material only on top of the first conductor.

18 Claims, 3 Drawing Sheets

LATERAL MIM DEVICE AND METHOD OF PRODUCTION

BACKGROUND OF THE INVENTION

1. Field of the Invention

The present invention relates to liquid crystal display devices and more particularly to MIM type nonlinear pixel driving elements and a method of manufacturing lateral MIM elements with substantially uniform operating characteristics. The invention further relates to a pixel driver element structure that provides improved operating characteristics in liquid crystal display devices.

2. Description of Related Art

Metal-insulator-metal (MIM) diodes are a common type of nonlinear element used to provide or control the driving voltage for signal conductors corresponding to individual pixels in liquid crystal displays and similar optical devices. A top view of a typical metal-insulator-metal (MIM) element is illustrated in FIG. 4 where it is shown being formed on a transparent element substrate 27 as a pixel driver element. A cross section taken along line I—I' extending through the same MIM element is shown in FIG. 5. Both of these figures show the use of a lateral (side surface) MIM structure in which only the side surface of an input signal conductor or electrode 21 is utilized as an input portion of the active pixel driver or control element. The MIM element is shown having a single output conductor 25 connected to one pixel electrode or conductor 26.

In forming conventional lateral MIM elements, such as illustrated in FIG. 4, all surfaces except the side surface 22 of the first signal conductor 21, i.e., where the MIM diode conduction occurs, are covered with a layer of insulating material to provide an electrical barrier layer 23. The electrical resistance of the barrier layer 23 is made sufficiently large so that it does not allow any other portion of the conductor 21 to function as part of the MIM diode. A lower resistance, typically thinner, insulating layer 24 is disposed on the side surface of the conductor 21 where the active MIM element is to be formed.

As seen in FIG. 5, material forming a second, output signal, conductor 25 for the nonlinear element is disposed on top of the insulating layers 24 and 23, and connects to the corresponding pixel electrode 26. A MIM diode is formed in the region where the first conductor 21, the insulator 24, and the second conductor 25 overlap and becomes the pixel voltage driving element for the pixel electrode 26 for one pixel of an associated display device. An array of such MIM driver elements is generally formed across the surface of the transparent element substrate 27 to achieve the desired optical display size and control.

This type of MIM structure, using known manufacturing techniques, allows the surface area of the MIM driver element to be made extremely small. This has proven to be an effective technology for increasing the density of pixel drivers and electrodes, and the manufacturing precision for liquid crystal display devices using MIM elements.

Several materials found useful in manufacturing the conductors for MIM elements include tantalum, aluminum, gold, ITO, NiCr+Au, and ITO+Cr, while useful insulator materials include $TaO_x$, $SiO_x$, $SiN_x$, $SiO_xN_y$, $TaN_x$ and $ZnO_x$. The insulating layers are generally formed by thermal or anodic oxidation, or by sputtering. In addition to inorganic compounds, polyimides and other organic materials can also be used in forming insulating barrier layers.

The most common structure used in manufacturing MIM driver elements is one that employs tantalum (Ta) for the first conductor 21, an oxide of tantalum ($TaO_x$) for the insulator 24, and chrome (Cr) for the second conductor, resulting in a Ta/$TaO_x$/Cr element structure.

However, using the conventional lateral MIM structure and manufacturing technique results in deviations in the characteristics of many of the MIM driver elements within a given optical display device. Because the lateral MIM element is formed on the side surface of the first conductor, where overlapped by the insulator 24 and second conductor 25, the surface area of the MIM element is proportional to the film thickness of the first conductor 21 and the angle formed between the side surface 22 and the transparent substrate 27, i.e., the cross sectional shape or taper of the side surface. Therefore, the area of the MIM element is very sensitive to variations in the film thickness or the side angle of the first conductor. Unfortunately, with current production process technology, the film thickness is often inconsistently distributed across a substrate which results in deviations in the operating characteristics of MIM elements distributed across the surface. The inability to precisely control MIM element surface area during the production process leads to inadequate control of pixel display conditions throughout a liquid crystal or similar type display device, that is, in the final product.

What is needed is a pixel voltage driver assembly using an array of MIM elements which provides substantially uniform device characteristics across the array, and, thus, across the optical device. It would also be beneficial if the MIM elements can be manufactured by a process of minimum complexity and in association with a variety of pixel driver applications.

SUMMARY OF THE INVENTION

In order to solve the problems encountered in the art, one purpose of the present invention is to provide a MIM device having improved reproducibility.

An advantage of the invention is that liquid crystal displays and similar optical devices can be produced having increased uniformity in pixel element operating characteristics.

Another purpose of the invention is to provide a liquid crystal display with improved operating characteristics and more uniform control response across an array of pixels.

These and other purposes, objects, and advantages are achieved in a lateral MIM element for use on a substrate for liquid crystal display devices wherein a first conductor, an insulator, and a second conductor are each formed by sequential deposition on a transparent substrate. The insulator is electrically contoured to have a lower resistance over at least one side and top edge than over the remaining, top, first conductor surface, so that electrical interaction between the first conductor and any other conductors positioned on the second insulator is prevented. This is generally accomplished by making the insulator thicker over the top surface than on the top edges and sides of the conductor, although materials of differing electrical resistance can also be used.

In a first embodiment, the insulator is made up of a first insulator formed on the side surfaces and top edges of the first conductor and a second insulator formed on the remaining area of the top surface, with the second insulator having a greater resistance, generally by being made sufficiently thicker than the first insulator, to prevent electrical interaction. The overlapping parts of the first conductor, the first insulator and the second conductor form a lateral MIM element for driving a pixel electrode in a liquid crystal display or similar optical device.

In further aspects of the invention, the conductor consists of material chosen from the group of Ta, Al, Au, ITO, NiCr+Au, and ITO+Cr, while the first and second insulators consist of material chosen from the group of $TaO_x$, $SiO_x$, $SiN_x$, $SiO_xN_y$, $TaN_x$ and $ZnO_x$. In the alternative, the insulators are made from organic compounds. In a preferred embodiment, the first conductor is manufactured using tantalum film approximately 250 nm thick, the first insulator using a $TaO_x$ film about 30–60 nm thick, and the second conductor using chrome (Cr), resulting in a $Ta/TaO_x/Cr$ device structure. This results in a combined first and second insulator thickness on the order of 300 nm or more.

The lateral MIM element of the invention is manufactured by, forming a first conductor on a support substrate and then forming and contouring a barrier layer or insulation material over the conductor so that insulation resistance is appropriately greater on a top surface of the first conductor than on the side and top edges. In a preferred embodiment, insulation material is deposited over the first conductor and etched back using a positive resist material which is exposed from the underside of the conductor. This leaves an island of insulation material on a portion of the top surface of the conductor. A second layer of, the same or a different, insulation material is then deposited over the conductor, and the first insulation material. Therefore, the electrical resistance of the insulation is contoured by controlling the deposition thickness to be thicker on the top surface. Alternatively, if the resist is a negative resist, after development and etching the first insulation material will only be left on the first conductor sides and top edges, exposing the remaining top surface of the conductor. A second insulator or insulation material of greater electrical resistance or thickness would then be deposited on this remaining top surface and the resist then removed along with excess insulation material.

Other objects and advantages together with a fuller understanding of the invention will become apparent and appreciated by referring o the following description and claims taken in conjunction with the accompanying drawings.

DESCRIPTION OF THE PREFERRED EMBODIMENTS

The present invention provides a new lateral MIM element structure found useful as a pixel electrode voltage driver, and a method of manufacturing the structure. The invention provides a contoured insulation layer structure which improves control over the MIM active element area and improves reproducibility of MIM element operating characteristics, especially across an array of such elements.

Figure 1:
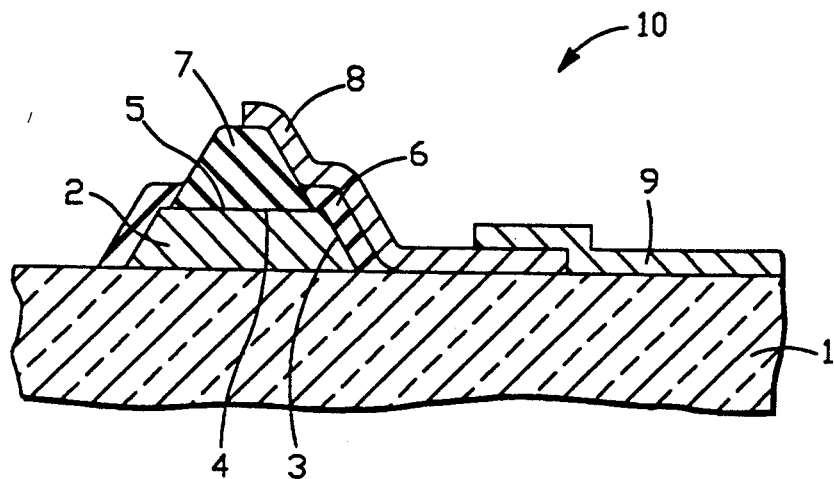
FIG. 1 is a cross section showing an embodiment of a lateral MIM element constructed according to the principles of the present invention.

The overall structure for the pixel voltage driver of the present invention is illustrated in the cross-sectional view of FIG. 1, and the individual method steps used to manufacture the element are illustrated in FIGS. 2(a) through 2(d).

As shown in the cross section of FIG. 1, a pixel driver element 10 is formed on a transparent substrate 1, on which is formed a transparent base film. Conductive material is deposited on the substrate and processed to form a first conductor 2, having side surfaces 3, upper or top edges 4, and a remaining top surface 5, which does not include the top edges 4. A material for forming a first insulator 6 is deposited on top of the first conductor 2, sides 3 and edges 4, and other desired portions of the display device substrate. A second insulator 7 is formed on the top surface of the first conductor 2, excluding the edges 4, and a second conductor 8 is then formed on top of the two insulators 6 and 7 followed by formation of the appropriate pixel electrode 9. Since the second insulator 7 is formed on the remaining part 5 of the conductor top surface, and is thicker or higher in resistance than the first insulator 6, only the laminated portion where the first conductor 2, first insulator 6, and second conductor 8 overlap functions as a nonlinear pixel driver element and none of the area covered or overlapped by the second insulator 7.

As seen in FIG. 1, the active portion of the MIM structure which makes up the pixel driver element 10 is formed on the top edges 4 of the first conductor 2 as well as the side surfaces 3. Therefore, the total, electrically active, surface area of the MIM element is the combined areas of the side surface 3 and the top edge 4, under the electrode or conductor 8.

As discussed above, a major problem with prior art MIM elements is deviations that occur in the surface area for any side surface 3; that is, the areas of the side surfaces 3 tend to vary due to deviations in film thickness during the manufacturing process. This is compounded by possible variations in the taper angle or shape of the first conductor sides relative to the substrate 1. However, it has been discovered that by using the MIM element structure of the present invention, the deviations in surface area of sides 3 can effectively be absorbed using the additional surface area of the upper edges 4. Therefore, as described below, the film thickness of the conductor material and any resist used in processing, shown in FIG. 2(b) as item 13, as well as the amount of exposure light for resist processing need only be optimized. As a result, deviations in the total active surface area of the MIM pixel driving element, which is now formed from the total of the side surfaces 3 and the top edges 4, are effectively decreased.

The preferred production process used to manufacture an element substrate for a liquid crystal display device using the MIM structure of the invention is illustrated in the steps of FIG. 2 [2(a)-2(d)]. FIG. 2(a) is a cross sectional view showing the transparent substrate 1 after formation from a transparent base film of material such as $TaO_x$ on which is formed an electrode or conductor 11 from material such as, but not limited to, tantalum as the first conductor and an insulating film 12 made from material such as $TaO_x$. The tantalum electrode 11 is generally formed by known deposition and photo-etching techniques, and the insulating $TaO_x$ film 12 is subsequently formed on top of the electrode 11 as a barrier layer by known techniques such as sputtering or chemical vapor deposition (CVD). In the illustrated embodiment of FIG. 2(a), the $TaO_x$ film 12 is also positioned on top of the transparent substrate 1, but it will be readily apparent to those skilled in the art that the film 12 need only extend over the side surfaces of the electrode 11 for purposes of the immediate invention, and other areas or surfaces to be covered are dependent upon specific applications.

Figure 2A:
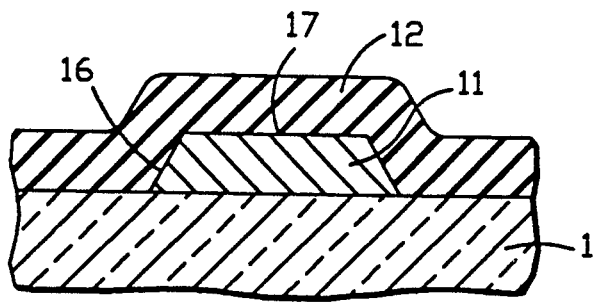
FIGS. 2(a-d) is a schematic overview of the manufacturing steps used according to the present invention to construct the element of FIG. 1.
Figure 2B:
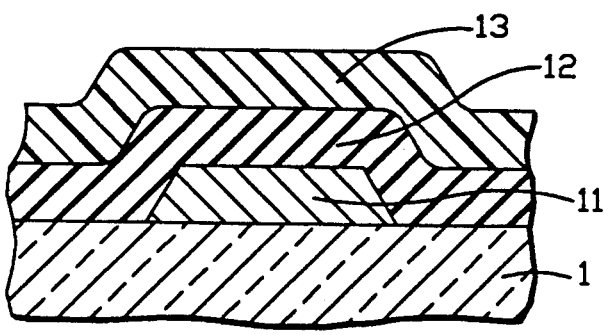
Figure 2B:
Figure 2C:
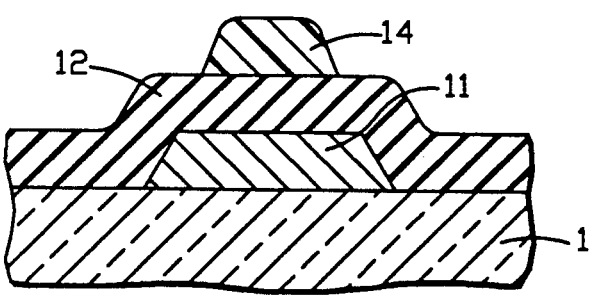

A layer of optically sensitive resist or photoresist 13, here with positive type photo-sensitivity (part where light does not strike is remaining resist) is applied to the surfaces 16 and 17 where the electrode 11 is present as shown in FIG. 2(b). The photoresist material is subsequently exposed to optical radiation from a direction opposite the conductor 11 surface of the transparent substrate 1, that is, from the rear surface of the transparent substrate 1, as shown by the directional arrows in FIG. 2(b). As a result, only the positive photoresist above the electrode 11, which is not sufficiently transparent to allow passage of a significant amount of the exposure light, is not exposed while the remaining resist is exposed, since the thin $TaO_x$ layer 12 and other oxide or nitride films are substantially transparent to the exposure light. Therefore, when developed, only that portion of the photoresist 14 positioned on top of, or above, the electrode 11 remains as shown in FIG. 2(c). With this resist in place, etching of the insulation material is performed using known techniques until the side surfaces of the electrode 11 are exposed, resulting in the configuration shown in FIG. 2(d).

Figure 2D:
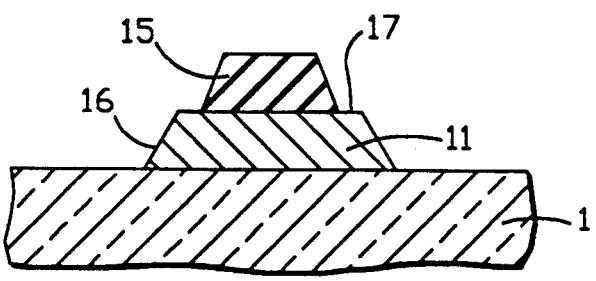
Figure 4:
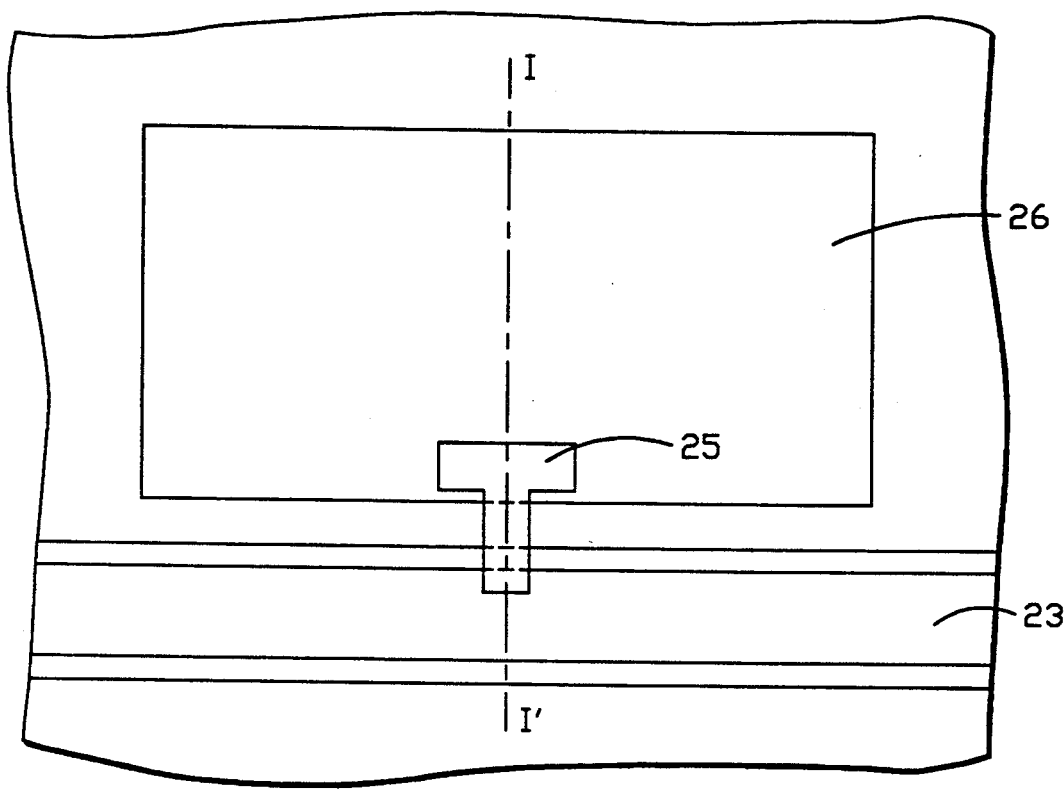
FIG. 4 is a top view of a conventional lateral MIM element used in a liquid crystal display device.
Figure 5:
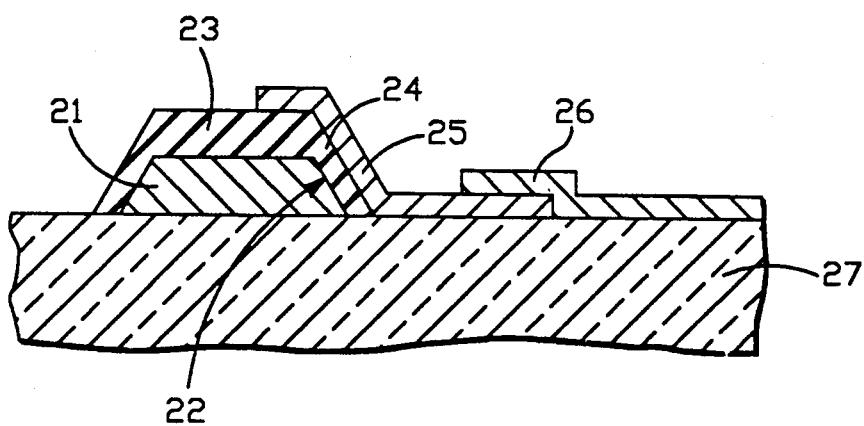
FIG. 5 is a cross section of the element and substrate of FIG. 4 taken along line I—I'.

As shown in FIG. 2(d), an insulating or barrier layer 15, made from the $TaO_x$ film, is, or remains, deposited on the top surface 17 of the electrode 11. This material becomes the second insulator which is used to create the requisite barrier layer 7. The side surfaces 16 and the top edges 17 are the surfaces of the electrode 11, but when etching is performed, the $TaO_x$ film 12 where the resist 14 is present on the top is not etched and only the other parts of the $TaO_x$ film 12 shown in FIG. 2(c) are etched as shown in FIG. 2(d). The etching rate of the $TaO_x$ material used for the insulation film 12 is constant, and, therefore, etching reaches the side surfaces 16 and the top edges of the conductor 11 at the same time when the $TaO_x$ film 12 is etched.

Figure 3:
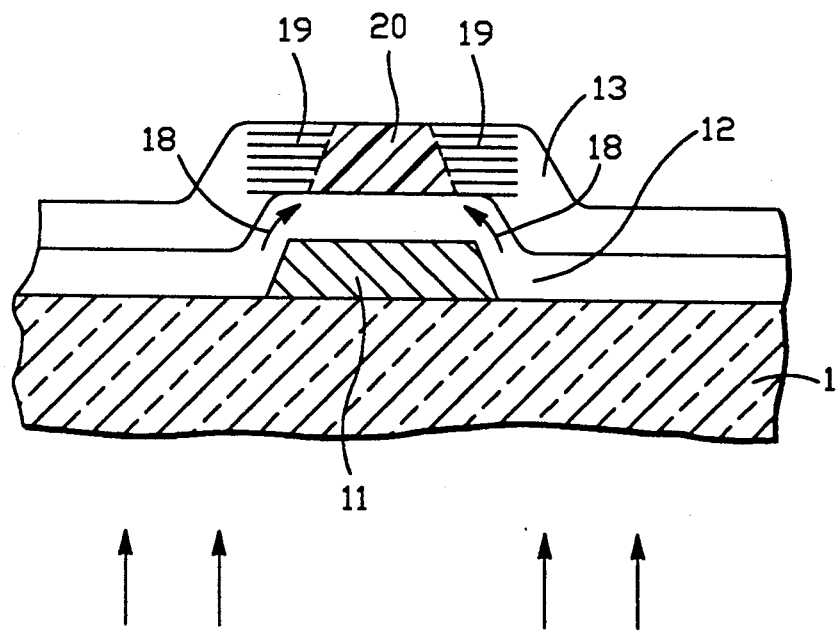
FIG. 3 is cross sectional diagram showing an embodiment of one portion of the production method of the invention.

An important factor in this MIM manufacturing process is controlling the position of the photoresist material 14 remaining after the exposure and developing steps. A portion of the exposure light contains a diffraction component 18 as shown in FIG. 3, which is directed inward of the electrode 11 shadow through interaction with the material 12. This transfers a significant amount of energy into a portion 19 of the photoresist otherwise shielded by the electrode 11, and part 19 of the positive resist present on top of the electrode 11 is sensitized by the exposure light during the exposure step shown in FIG. 2(b). Therefore, the position of the resist 20 remaining after development is generally slightly narrower than the top surface 17 of the electrode 11 and can be controlled by appropriately setting the exposure conditions in advance. Variations in the conductor or electrode 11 size are automatically compensated for by using this back side exposure technique.

An exemplary embodiment for pixel control elements having little deviation in element surface area can be achieved by employing an approximately 250 nm thick tantalum film for the electrode 11 with a $TaO_x$ film about 300 nm thick for the insulator or barrier layer 12. Positive photoresist 14 is deposited as an approximately 1300 nm thick film and exposed from the rear surface of the substrate 1 using an illumination energy of about 70 mj/cm². This typically results in exposing about 600 nm of the top conductor edges.

After formation of the barrier or insulation layer 15, another insulating film in the form of a thin $TaO_x$ film is formed as the first insulator on the side surfaces 16 and exposed top edges 17 of the electrode 11. This is typically accomplished by anodic or thermal oxidation after obtaining the configuration shown in FIG. 2(d). Chrome is then deposited in preparation to form both the second conductor 8 and the pixel electrode 9 (FIG. 1), and the appropriate conductor and pixel electrode patterns are then formed by techniques such as photo-etching, producing the element shown in FIG. 1.

Using the previous exemplary embodiment, the second $TaO_x$ film would be deposited as a thin film on the order of 60 nm thick, followed by a layer of chrome (Cr) for the second conductor and, generally, ITO for the pixel electrode.

Alternatively, if the photoresist is a negative resist, after initial development and etching insulation material will only be left on the first conductor sides and top edges, exposing the remaining top surface of the conductor. The second insulation material of greater electrical resistance or thickness is then deposited on this remaining top surface and the resist removed along with excess second insulation material to provide the structure of FIG. 1.

The resulting structure employs not only the side edge of the first conductor but also a portion of the outer top surface edge of the conductor for the active MIM element area. If the size of the area used along the top edge 4 of the first conductor 2 is chosen appropriately, this additional area is much larger than anticipated variations in the film thickness for the film used for the first conductor. Therefore, any film thickness variations are effectively absorbed in terms of their impact on the active area of the MIM element and a great degree of element-to-element reproducibility and uniformity is achieved across an array of such elements. Variations in the conductor size are also compensated for by using the back side exposure process.

In contrast to element substrates that used prior art lateral (side surface) MIM elements for the pixel element, MIM elements produced using the inventive method now have substantially uniform element-to-element operating characteristics, thus solving many of the problems encountered in large surface area liquid crystal or display and similar devices.

While the invention has been described in conjunction with several specific embodiments, it is evident to those skilled in the art that many further alternatives, modifications, and variations will be apparent in light of the forgoing description. For example materials other than tantalum are useful for forming MIM conductors, and many materials have been found useful for manufacturing the insulators. At the same time, the disclosed MIM structure may be useful for application to voltage driver elements other than for liquid crystal display devices. Thus, the invention described herein is intended to embrace all such alternatives, modifications, applications and variations as may fall within the spirit and scope of the appended claims.

What is claimed is:

1. A lateral MIM device comprising:
   a first conductor;
   an electrically contoured insulator formed on said first conductor having a first resistance value where it covers at least one side surface and top edge to allow MIM electrical interactions and a second higher resistance where it covers the remaining top surface so as to substantially prevent electrical interactions over this surface; and
   a second conductor disposed on top of said first insulator.

2. The lateral MIM device of claim 1 wherein said contoured insulator comprises insulation material covering said first conductor side surfaces and top edges of a first thickness and insulation material covering the remainder of said first conductor top surface having a second greater thickness sufficient to prevent electrical interaction with said first conductor over this surface.

3. The lateral MIM device of claim 1 wherein said contoured insulator comprises:
   a first insulator formed on side surfaces and top edges of said first conductor having a first resistance value; and
   a second insulator formed on and covering the remainder of a top surface of said first conductor and having a second greater resistance value sufficient to prevent electrical interaction of said first conductor and other adjacent conductors.

4. The MIM device of claim 3 wherein said first and second insulators comprise the same material and said second insulator is deposited thicker than said first insulator.

5. The MIM device of claim 2 wherein said conductor consists of material chosen from the group of Ta, Al, Au, ITO, NiCr+Au, and ITO+Cr.

6. The MIM device of claim 2 wherein said first and second insulators consist of material chosen from the group of $TaO_x$, $SiO_x$, $SiN_x$, $SiO_xN_y$, $TaN_x$ and $ZnO_x$.

7. The MIM device of claim 2 wherein said first and second insulators comprise organic compounds.

8. The MIM device of claim 2 wherein first conductor comprises approximately 250 nm thick tantalum film, said first insulator comprises a $TaO_x$ film about 30–60 nm thick, and said second conductor comprises chrome (Cr), whereby a Ta/$TaO_x$/Cr device structure is formed.

9. A pixel electrode driver for use in a liquid crystal display device comprising:
   a first conductor disposed on a transparent substrate;
   a first substantially transparent insulator formed on side surfaces and top edges of said first conductor;
   a second substantially transparent insulator formed on a top surface of said first conductor with said second insulator having a greater electrical resistance than said first insulator; and
   a second conductor disposed on top of said first insulator;
   whereby overlapping parts of said first conductor, said first insulator, and second conductor form a lateral MIM device.

10. The pixel electrode driver of claim 1 wherein said insulators comprise the same material and said second insulator is deposited thicker than said first insulator.

11. A method of manufacturing a lateral MIM element for use as a pixel electrode driver, comprising the steps of:
   forming a first conductor on a support substrate;
   forming an electrically contoured insulator on said first conductor such that side surfaces and top edges of said first conductor are covered with insulation material of a first resistance and the remainder of said first conductor top surface is covered with insulation material of a second larger resistance which is sufficient to prevent electrical interaction with said first conductor over this surface; and
   disposing a second conductor on top of said insulator.

12. The method of claim 11 wherein the step of forming an electrically contoured insulator comprises the steps of:
   covering said first conductor side surfaces and top edges with insulation material having a first resistance value; and
   covering the remainder of said first conductor top surface with second insulation material having a second greater resistance sufficient to prevent electrical interaction with said first conductor over this surface.

13. The method of claim 11 wherein the step of forming an electrically contoured insulator comprises the steps of:
   forming a first insulator on said side surfaces and top edges of said first conductor having a first resistance value; and
   forming a second insulator on said top surface having a second greater resistance value sufficient to prevent electrical interaction with said first conductor over this surface.

14. The method of claim 13 wherein said first and second insulators are formed from the same material and said second insulator is deposited thicker than said first insulator.

15. The method of claim 13 wherein said steps of forming said first and second insulators further comprises the steps of:
   forming a thin film of a first substantially transparent insulation material of a first resistance on said first conductor in a predetermined thickness;
   applying a film of optically sensitive resist on the first conductor;
   exposing said resist where located on the sides and top edges of the first conductor, from the under side of the transparent substrate, until it is photosensitized;
   developing the resist;
   etching the first insulation material until the sides and top edges of the first conductor are exposed; and
   forming a second insulation material layer on said first layer, sides and top edges.

16. The method of claim 15 wherein said first and second insulators are formed from the same material and said second insulator is deposited thicker than said first insulator.

17. The method of claim 15 wherein said first and second conductors consist of material chosen from the group of Ta, Al, Au, ITO, NiCr+Au, and ITO+Cr.

18. The method of claim 15 wherein said first and second insulators consist of material chosen from the group of $TaO_x$, $SiO_x$, $SiN_x$, $SiO_xN_y$, $TaN_x$ and $ZnO_x$.

* * * * *